United States Patent
Atkin et al.

(10) Patent No.: US 11,902,682 B2
(45) Date of Patent: Feb. 13, 2024

(54) AMPLITUDE MODULATED PIXEL SETUP FOR HIGH-SPEED READOUT OF CMOS IMAGE SENSORS

(71) Applicant: WiDR Inc., Calgary (CA)

(72) Inventors: Devin Atkin, Calgary (CA); Orly Yadid-Pecht, Calgary (CA); Ulian Shahnovich, Calgary (CA)

(73) Assignee: UTI LIMITED PARTNERSHIP, Calgary (CA)

( * ) Notice: Subject to any disclaimer, the term of this patent is extended or adjusted under 35 U.S.C. 154(b) by 95 days.

(21) Appl. No.: 17/334,560

(22) Filed: May 28, 2021

(65) Prior Publication Data
US 2021/0377475 A1     Dec. 2, 2021

Related U.S. Application Data

(60) Provisional application No. 63/031,846, filed on May 29, 2020.

(51) Int. Cl.
| | |
|---|---|
| *H04N 25/75* | (2023.01) |
| *H01L 27/146* | (2006.01) |
| *H04N 25/766* | (2023.01) |
| *H04N 25/772* | (2023.01) |

(52) U.S. Cl.
CPC ....... *H04N 25/75* (2023.01); *H01L 27/14643* (2013.01); *H04N 25/766* (2023.01); *H04N 25/772* (2023.01)

(58) Field of Classification Search
CPC ......... H01L 27/14643; H01L 27/14612; H01L 27/1464; H01L 27/14645; H04N 5/3741; H04N 5/37455; H04N 5/378; H04N 5/341; H04N 5/35518; H04N 19/423; H04N 19/436; H04N 19/59; H04N 19/85; H04N 3/1512; H04N 9/70; H04N 23/12; H04N 23/61; H04N 23/611; H04N 23/67; H04N 23/69; H04N 23/843; H04N 25/133; H04N 25/134; H04N 25/136; H04N 25/616; H04N 25/76; H04N 25/40; H04N 25/573; H04N 25/75; H04N 25/766; H04N 25/772; A61P 1/18; A61P 11/00; A61P 11/02; A61P 11/06; A61P 11/14; A61P 27/16; A61P 31/04; A61P 31/10; A61P 31/12;

(Continued)

(56) References Cited

U.S. PATENT DOCUMENTS

| | | | |
|---|---|---|---|
| 6,718,093 | B2 | 4/2004 | Zhou |
| 7,659,925 | B2 | 2/2010 | Krymski |
| 7,847,233 | B2 | 12/2010 | Fukushima |

(Continued)

FOREIGN PATENT DOCUMENTS

| | | |
|---|---|---|
| GB | 2438693 | 12/2007 |

*Primary Examiner* — Antoinette T Spinks
(74) *Attorney, Agent, or Firm* — Brion Raffoul

(57) ABSTRACT

An apparatus for increasing readout speed for Complimentary Metal Oxide Semiconductor (CMOS) image sensors. The apparatus is useful with CMOS image sensors in all high-tech industries and used to capture images digitally. Specifically, the apparatus provides a CMOS image sensor which employs an analog network-on-chip for increasing readout speed. The apparatus includes an array of carrier signal generators which are used to modulate the pixel exposure to allow all pixels to be read and discerned simultaneously.

25 Claims, 6 Drawing Sheets

(58) Field of Classification Search
CPC .......... A61P 33/10; A61P 37/08; A61P 43/00;
A61P 5/00; C07D 401/12; C07D 401/14
USPC .......... 250/208.1, 241; 348/221.1, 234, 349,
348/364; 341/257
See application file for complete search history.

(56) References Cited

U.S. PATENT DOCUMENTS

| | | |
|---|---|---|
| 9,036,068 B2 | 5/2015 | Wada et al. |
| 2004/0246354 A1 | 12/2004 | Yang et al. |
| 2005/0023437 A1 | 2/2005 | Huang et al. |
| 2006/0214086 A1* | 9/2006 | Fukushima ............ H04N 25/76 348/E3.029 |
| 2012/0013774 A1 | 1/2012 | Kim et al. |
| 2012/0085910 A1* | 4/2012 | Kryskowski .............. G01J 5/14 250/349 |
| 2013/0087683 A1 | 4/2013 | Mo et al. |

\* cited by examiner

Figure 1: Basic Pixel Signal Flow.

Figure 2: Overall Signal Flow Graph

Figure 3: Amplitude modulated pixel set up for continuous operation.

Figure 4: Frequency Response of Modulated Carriers.

Figure 5: Rolling vs. Global Shutter

AMPLITUDE MODULATED PIXEL SETUP FOR HIGH-SPEED READOUT OF CMOS IMAGE SENSORS

TECHNICAL FIELD

The present invention relates to Complementary Metal-Oxide-Semiconductor (CMOS) image sensors. More specifically, the present method and apparatus relate to the manner by which image sensors transmit individual photodiode voltages out of a semiconductor chip.

BACKGROUND

Conventional CMOS imager readout mechanisms typically operate in the following way. An array of pixels containing photodiodes exists along with peripheral circuitry to read an electric current induced by the action of light (i.e., photocurrent), amplify that photocurrent, and convert such photocurrent into the digital domain. In a shuttered sensor operation for CCD and CMOS image sensors, shutter operation consists of the following stages: reset, integration, sample, and readout. These operations may be successive row by row in the pixel array, or simultaneous across all rows depending, respectively, on whether the shutter operation is rolling or global. A typical timing structure can be seen in prior art FIG. 5. In this technique as illustrated, pixels are reset to the maximum positive voltage on a semiconductor chip, and then after an integration time, the new pixel voltage is transferred to a charge storage capacitor and amplified with a common source amplifier to a column bus. The column voltage is then read with an Analog to Digital converter, where the digital value can be encoded into a standard image format.

Disadvantageously, this prior art technique places limitations on the readout speed of the CMOS image sensor. This limitation is exhibited as limited frames per second. In the prior art, attempts at alleviating this limitation in an attempt at increasing the frame rate has been accomplished by various methods. These methods include but are not limited to: decreasing the pixel array size so that fewer pixels need to be checked; shortening the integration time to allow for faster readout; adding additional readout circuitry to increase the number of pixels read simultaneously; adding additional circuitry to amplify signals as they are transferred around the chip; or improved layouts to decrease the effects of parasitic capacitance on readout speed.

One such prior art attempt includes United States Patent Application Publication No. 2013/0087683 titled "Multiple Row Concurrent Readout Scheme for High-Speed CMOS Image Sensor with Backside Illumination" which relates to a system, method and apparatus implementing a multiple-row concurrent readout scheme for high-speed CMOS image sensor with backside illumination are described herein. In one embodiment, the method of operating an image sensor starts acquiring image data within a color pixel array and the image data from a first set of multiple rows in the color pixel array is then concurrently readout. Concurrently reading out the image data from the first set of multiple rows includes concurrently selecting a first portion of the image data from the first set by first readout circuitry and a second portion of the image data from the first set by second readout circuitry. The first and second portions of the image data from the first set are different and the first and second readout circuitries are also different.

This prior art (US 2013/0087683) is understood to increase the readout speed for backside-illuminated sensors by adding additional readout circuitry to allow for multiple rows to be read out concurrently. This system allows for an approximate doubling of frequency, with predicted framerates of up to 98.77 fps for 3 mega-pixel sensors.

Another such prior art attempt includes U.S. Pat. No. 7,659,925 titled "High Speed CMOS Image Sensor Circuits with Memory Readout" which relates to an image sensor circuit which includes a pixel array, a plurality of column analog-to-digital conversion (ADC) circuits, and at least two memory blocks. Each column ADC circuit is connected to receive analog pixel signals provided from corresponding pixel circuits of the pixel array, and is configured to convert the received analog pixel signals into digital pixel signals. Each memory block is connected to receive digital pixel signals provided from corresponding column ADC circuits of the plurality of column ADC circuits. At least two of the at least two memory blocks are connected to receive digital pixel signals that are provided from corresponding column ADC circuits that are located to a same side of the pixel array. Each memory block of the at least two memory blocks includes a plurality of memory cells, one or more sense amplifiers connected to the memory cells by a readout bus, and a memory controller.

This prior art (U.S. Pat. No. 7,659,925) is understood to increase the readout speed by the addition of memory blocks to allow for reduced line lengths to compensate for bus capacitances on column-parallel ADCs. They achieve 10,000 fps while requiring multiple memory regions.

Another such prior art attempt includes United States Patent Application Publication No. 2004/0246354 titled "CMOS Image Sensor having High Speed Sub Sampling" which relates to a method of sub sampling signals from an image sensor having a pixel array. The pixel array has a plurality of columns, each column having a column readout circuit. The method comprises averaging the signals output by a plurality of adjacent column readout circuits and outputting the averaged signal to an output bus.

This prior art (US 2004/0246354) is understood to add averaging circuits such that blocks of pixels can be activated and averaged for high-speed readout during specific points of operation to allow for temporary increases in speed. This method allows for a temporary increase in readout speed at the cost of pixel resolution.

Another such prior art attempt includes United States Patent Application Publication No. 2005/0023437 titled "Frame-Shuttered CMOS Image Sensor with Simultaneous Array Readout" which relates to a frame shuttered CMOS image sensor with simultaneous array readout. An array of CMOS pixels is printed on a silicon substrate. Within each pixel is a light sensitive region comprising a photo sensitive diode for converting photons into electrical charge and at least three transistors to permit reading of reset electrical charges and collected electrical charges and for resetting the photosensitive diode. The sensor includes an array of signal and reset readout capacitors located on the substrate but outside of the pixel array. Metal conductors printed in said substrate connect each pixel in said pixel array with a signal capacitor and a reset capacitor in array of signal and reset readout capacitors. Transistor switches printed in said substrate but outside of said pixel array are used to isolate the signal and reset capacitors from each other and from the pixels. Control circuitry is provided for resetting simultaneously each of the pixels in the pixel array, for collecting simultaneously reset signals from each pixel on to one of the reset capacitors in the array of readout capacitors and for collecting simultaneously integrated pixel signals from each pixel on to one of the signal capacitors in the array of readout capacitors. Readout circuitry is provided for reading charges collected on the array of signal and re-set capacitors.

This prior art (US2005/0023437) is understood to add a capacitor array to the periphery of the circuit to allow accumulated charge to be simultaneously transferred out of the array for readout in a globally shuttered scheme. This functionality allows for significant increases in readout speed at the cost of large amounts of chip area to contain the required capacitive array and significant difficulties in routing the required metal lines. These issues make the technique unfeasible for large sensor arrays.

Another such prior art attempt includes U.S. Pat. No. 9,036,068 titled "CMOS Image Sensor with Fast Read Out" which relates to an image pickup element includes a plurality of read signal lines; a pixel unit in which a plurality of pixel circuits are arranged in a matrix form, the plurality of pixel circuits in the pixel unit being divided into groups of pixel circuits so that each of the groups is provided in a corresponding one of columns, each of the groups of pixel circuits being connected to a corresponding one of the plurality of read signal lines; and a processing unit configured to process read signals that the plurality of pixel circuits, which are divided into groups, output to the plurality of read signal lines, which are connected to the plurality of pixel circuits.

This prior art (U.S. Pat. No. 9,036,068) is understood to add a second instance of the column readout circuit and divides the pixels between the two readout paths to increase the frame rate. This system approximately doubles the frame rate at the cost of readout complexity and area—i.e., two output columns per column of pixels.

Another such prior art attempt includes United States Patent Application Publication No. 2012/0013774 titled "CMOS Image Sensor for High-Speed Signal Processing" which relates to a CMOS image sensor that includes: a plurality of CDS/PGAs (correlating double sampling/programmable gain amplifiers) for processing output signals of pixels corresponding to same colors on different paths; and an offset difference removing part for removing offset difference that occurs when the same color signals are processed on the different paths, wherein the offset difference removing part includes: a dummy pixel array where light is shielded; a unit for reading signals of the dummy pixel array through the CDS/PGAs and storing average offset values for each path; and a signal synthesizing unit for synthesizing the average offset values and signals of an effective pixel array, which are read through the respective CDS/PGAs, and outputting signals of which offset difference is removed.

This prior art (US 2012/0013774) is understood to have additional processing for a multiple readout path setup to remove any differing offsets between pixels processed along different paths. This system mitigates some of the negative side-effects associated with multiple readout paths.

Another such prior art attempt includes U.S. Pat. No. 7,847,233 titled "Method and Apparatus for Determining Changes in Physical Information Incident on a Detecting Device" which relates to a physical information acquiring method of acquiring physical information for a predetermined purpose on the basis of change information that is acquired under predetermined detection conditions for a physical quantity using an portion for physical quantity distribution detection. The portion for physical quantity distribution detection includes a detector that detects change information corresponding to a change in a physical quantity made incident on the detector and has unit components that output unit signals based on the change information detected by the detector arranged in a predetermined order. In the physical information acquiring method, a carrier signal is converted into a signal related to a frequency on the basis of the change information detected by the detector. The physical information for a predetermined purpose is acquired using the signal related to a frequency.

This prior art (U.S. Pat. No. 7,847,233) is understood to use a voltage to frequency or voltage to phase conversion to combat issues with the ADC operation for large sensor sizes and high frame rates. The patent outlines a system that performs frequency or phase modulation of the photodiode exposure. This conversion is to allow an ADC which can operate through either observing the phase difference between the carrier and the pixel output (for phase modulation) or counting the pulse width of the pixel output compared to the carrier pulse width (for frequency modulation). Such method still requires individual pixels on a column to be read separately and does not allow for any multiplexing of multiple pixels for simultaneous output on the same line. Relative to the invention disclosed herein, this prior art performs both different functionalities and operates based on different principals.

Another such prior art attempt includes Great Britain Patent No. 2438693 titled "Imager Readout Circuit with ADCs Coupled to Plural Columns and a Ramp Signal Generator" which relates to a readout circuit for an imaging array comprises plural ADC circuits, each being respectively coupled to associated first- and second-pixel columns. A ramp signal generator is connected to the analog to digital conversion circuits, providing a common ramp comparison signal to each ADC. Also independently claimed are readout circuits in which: digital image memory locations are controlled so different memories may be simultaneously written and read (via a multiplexing circuit); plural columns are read, a common comparison signal is provided, and a an output logic signal results from a comparison; and a method of manufacturing a pixel array in which comparator, ADC, memory banks and ramp circuits are formed.

This prior art (GB 2438693) is understood to use an imager containing a series of ADCs using a common ramp signal for the ADC operation, though this patent does not involve any form of multiplexing of pixel data for simultaneous output onto the column busses and does not operate through any common principals relative to the invention disclosed herein.

Another such prior art attempt includes U.S. Pat. No. 6,718,093 titled "Integrated Optical Multiplexer and Demultiplexer for Wavelength Division Transmission of Information" which relates to a multiplexer/demultiplexer for optical interconnection between electronic components on an integrated circuit chip. The multiplexer/demultiplexer includes a substrate formed with an array of photo emitters/detectors and conditioning electronics coupled thereto. A first layer of optically transparent material is formed on the substrate overlying the emitters/detectors and a second layer of optically transparent material, functioning as an optical waveguide, is formed on the first layer. A binary blazed grating is formed at the interface of the two layers. For multiplexing, discrete wavelength optical signals are modulated with data, emitted by the emitters, intercepted by the binary blazed grating, and multiplexed into a polychromatic beam for transmission through the waveguide. For demultiplexing, the discrete wavelengths are separated by the binary blazed grating and directed to corresponding detectors. The conditioning electronics receive and demodulate the output of the detectors to extract data and format the data for communication with electronic components.

This prior art (U.S. Pat. No. 6,718,093) is understood to operate the process of Wave Division Multiplexing (WDM) whereby signals are modulated onto differing optical frequencies and transmitted over optical waveguides on-chip and are then demodulated elsewhere on-chip using binary blazed gratings and photo detectors. This prior art relates solely to the creation of these optical networks-on-chip. If re-applied to the area of CMOS image sensors, this prior art would require either individual analog to digital converters for each pixel, or time-division of the conversion to switch between pixels.

Although many of these prior art mechanisms may be prevalent in commercial chips and have provided improvement, there is still demand for further improvement. The prior art marginally increases produced frame rate; however, none achieve arbitrarily high frame rates as the prior art still suffers from the previous limitations in their ability to read rows concurrently. What is needed is a method and apparatus which allows all pixels on a bus that may be read concurrently and continuously using a single analog to digital converter.

SUMMARY

The present method and apparatus provide CMOS image sensors for digitally capturing images. The present method and apparatus relate to the manner by which image sensors transmit individual photodiode voltages out of a semiconductor chip. Such image sensors typically have frame rates in the range of approximately 30-100,000 frames per second (fps) depending on the given sensor, although higher frame rates come with different trade-offs in image quality. The present invention serves to increase the readout speed of the image sensor to allow for a higher frame rate to be captured without the regular trade-offs.

The method and apparatus of the present invention involve an analog network-on-chip in order to carry data simultaneously out of the pixel array and to systems that convert the analog data into the digital domain to be processed and encoded as a standard image. Advantageously, the present invention allows for arbitrarily high frame rates.

The invention involves replacing the regular column and row decoding circuitries with analog signal generators of varying frequency or phase. While the generated signals are preferably sinusoids, it should be understood however that such generated signals may be any signals which do not interfere in the frequency domain. The signals are used in place of the standard pixel select circuitries such that all pixels output a current proportional to the pixel exposure modulated by a given sinusoid. So long as no two pixels on a bus receive signals that overlap in the frequency domain, the signal may be sampled by an analog to digital converter, and individual pixels may be recovered through digital filtering and demodulation techniques.

In a first aspect, the present invention provides an apparatus for sensing an image, said apparatus comprising: an array of pixels with intensity-based readout; and an analog network including at least two carrier generators operably coupled to said array of pixels.

In a second aspect, the present invention provides an analog network on a chip comprising: at least one carrier signal generator; and a plurality of pixels communicating simultaneously.

In a third aspect, the present invention provides a method for sensing an image, said method comprising: providing an array of pixels having an intensity-based readout; and coupling said array with an analog network of at least two carrier generators.

In a further aspect, the present invention provides a system for sensing an image, the system comprising:—an array of pixels, each pixel having an intensity-based output;—a plurality of mixer circuit elements; and—at least one bus line to which mixer circuit elements are coupled, each of said at least one bus line carrying a bus signal; wherein, for a plurality of said pixels, each pixel's output is mixed by one of said mixer circuit elements with a carrier signal such that said bus signal on said at least one bus line is a superposition of multiple pixel outputs modulated by said carrier signal.

BRIEF DESCRIPTION OF THE DRAWINGS

The present invention will now be described by reference to the following figures, in which identical reference numerals refer to identical elements and in which.

DETAILED DESCRIPTION

While the present description provides for specific details, it should be understood that such details are presented for purposes of illustration and are not to be taken as limiting any particular implementation of the present invention whereby other implementations may be practiced without these specific details. As well, it should be understood that the specifics of standard circuit architectures have been removed in order to ease understanding of the description.

Figure 1:
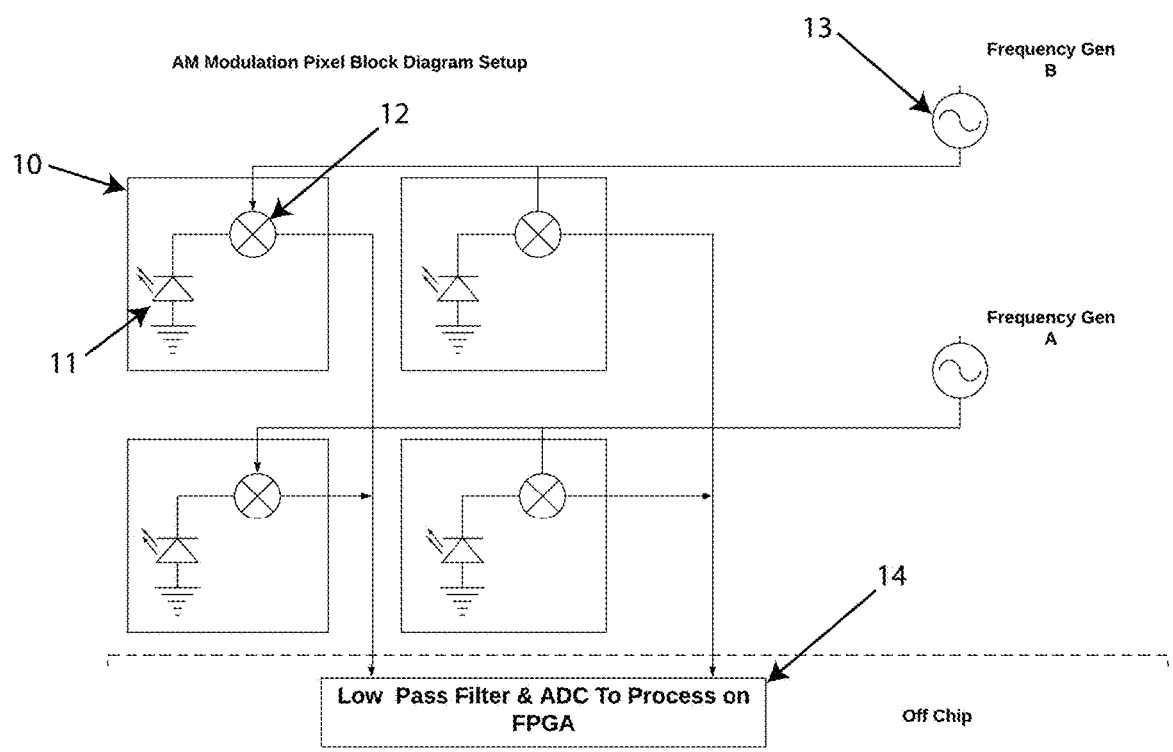
FIG. 1 is a diagram of a 2×2 pixel grid illustrating the basic information flow in terms of on-chip and off-chip components for an embodiment of the present invention.

Referring now to FIG. 1, one embodiment of the present invention is illustrated. Here, a diagram of a 2×2 pixel grid showing the basic information flow in terms of on-chip and off-chip components for an embodiment of the present invention. As shown, each pixel 10 includes a photodiode 11 which outputs to a mixer 12 into which a reference oscillator 13 feeds a generated carrier signal. As shown, each set (row-wise) of pixels on the 2×2 grid is fed by a different reference oscillator (frequency generator A and B). The 2×2 grid are an on-chip analog network. The off-chip components as shown may include a low pass filter and an ADC (analog to digital converter) for further processing of the output of the pixel grid. Such off-chip components may be embodied in an integrated circuit such as a field-programmable gate array (FPGA). The frequency generators may also be moved off chip without changing the function of the sensor.

Figure 4:
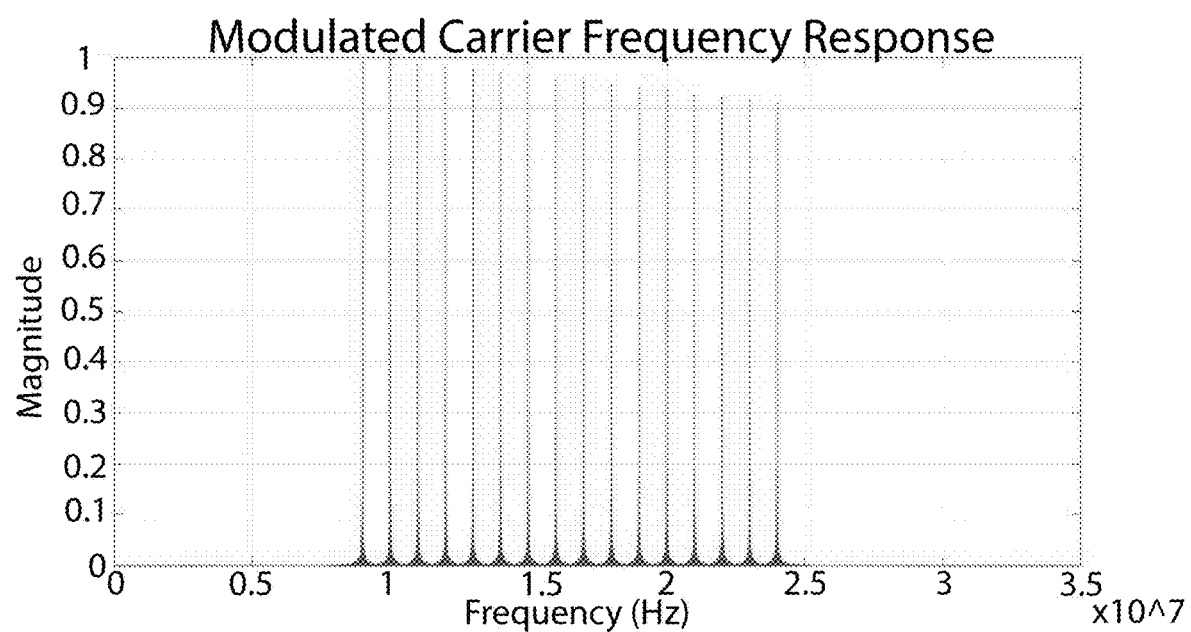
FIG. 4 shows a graphical representation of a Fast Fourier Transform (FFT) of an expected column bus output given ideal carriers and signals in accordance with the present invention.
Figure 5:
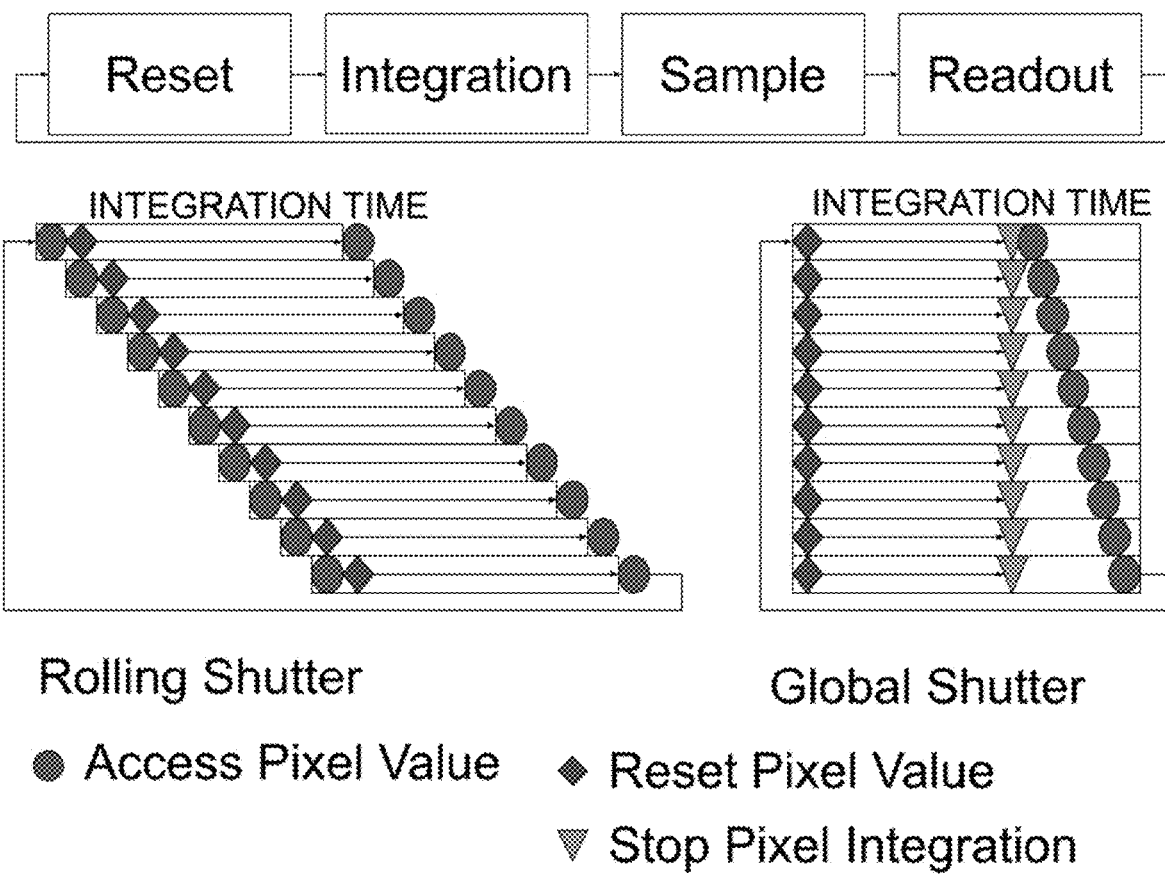
FIG. 5 illustrates a known schematic representing rolling and global shutting schemes in accordance with the prior art.
Figure 6:
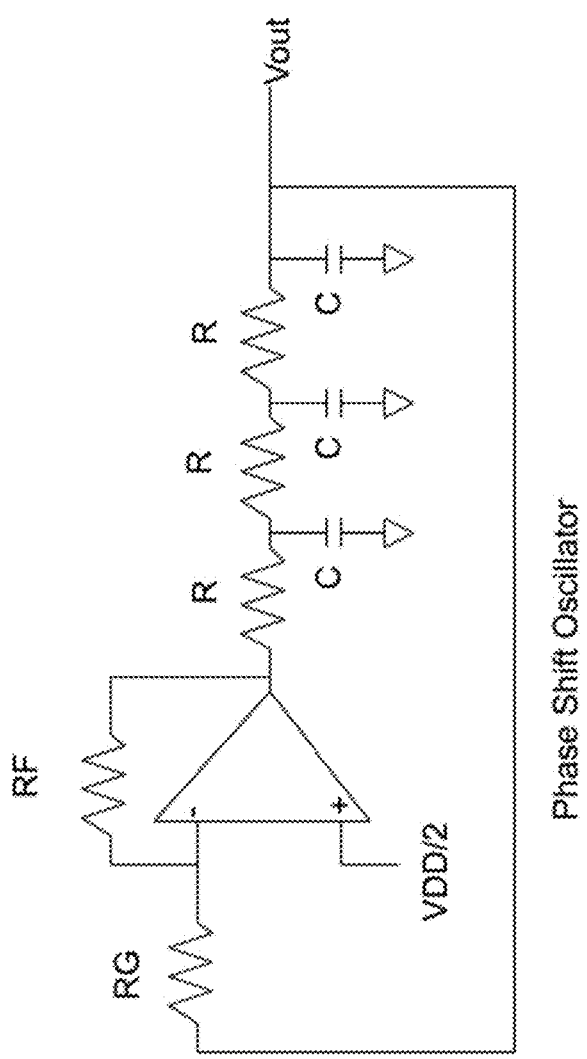
FIG. 6 illustrates a standard sinusoidal phase shift oscillator.

The present invention serves to increase readout speed in CMOS image sensors in a manner similar to the principle in radio where a carrier wave modulates a low-frequency data signal for transmission. In this way, different carrier frequencies allow for signals to be transmitted simultaneously without interference. One preferred embodiment implements sinusoidal carrier waves using standard circuit architectures. A standard sinusoidal phase shift oscillator is shown in FIG. 6. It should, however, be clear that other possible oscillators that could be used include but are not limited to the Wien bridge oscillator, the Bubba oscillator, and the quadrature oscillator. The carrier waves may take any form so long as they do not overlap in the frequency domain in a way that cannot be reversed. For example, generated sinusoids should be of different frequencies and phases such that they may be demodulated later in the signal chain. These non-overlapping carriers are observable in FIG. 4 as the series of spikes representing the carriers, and the surrounding taper showing the pixel exposure. Of course, alternate implementations may include other carrier shapes. These carrier signals are then modulated with a value representing the pixel exposure.

Regarding the frequencies used for the carrier waves, these should be different. The difference in frequency primarily determines the obtained frame rate. As an example, if the carrier frequencies are 1 MHz apart, then the maximum theoretical frame rate is 500,000 fps. However, if the carrier frequencies are 2 MHz apart, then the maximum obtainable frame rate is 1,000,000 fps.

Modulation of the carrier signal with the pixel exposure voltage as illustrated in the figures is accomplished as follows.

Figure 2:
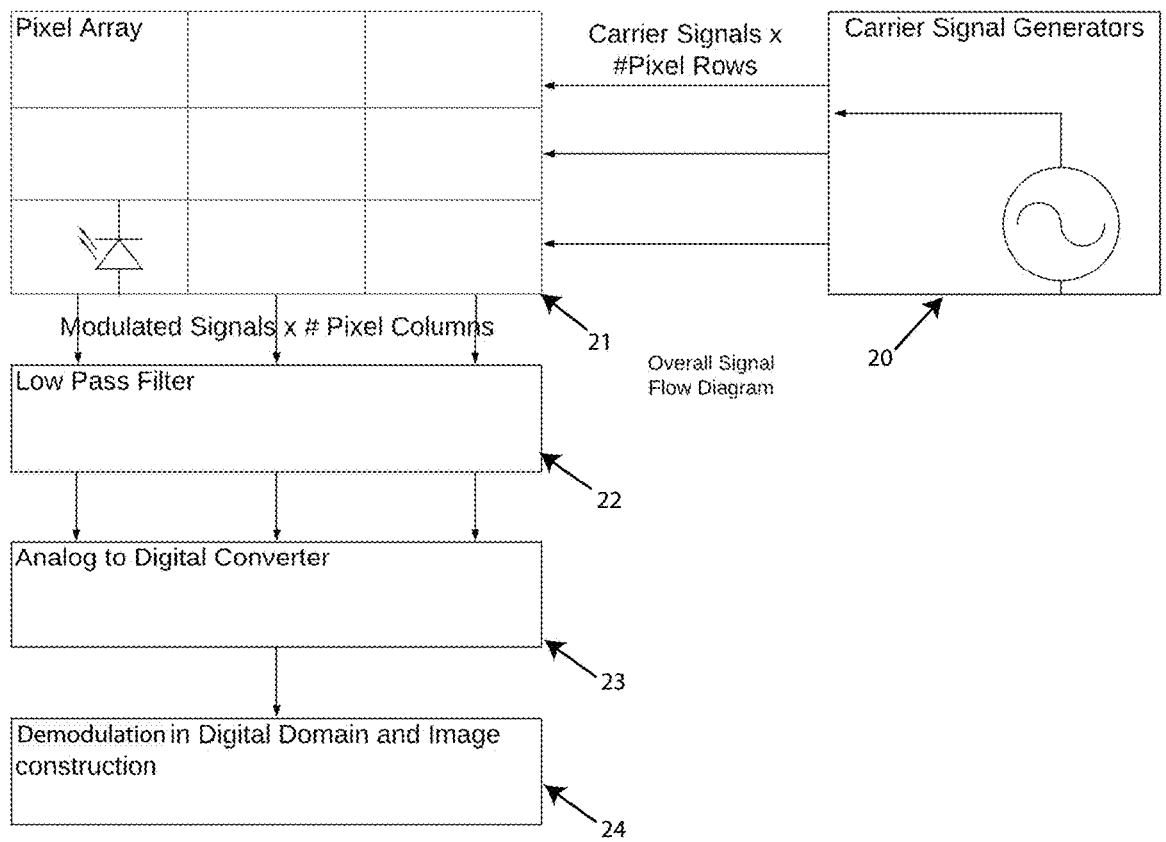
FIG. 2 is a signal flow graph illustrating the flow of information from the carrier signal generators to the low pass filter to the ADC to demodulation in accordance with the present invention.

With reference to FIG. 2, there is shown a signal flow of information from the carrier signal generators 20 through the pixel array 21 to the off-chip elements comprising the low pass filter 22, ADC 23, and module 24 for demodulation and image construction in accordance with the present invention.

Figure 3:
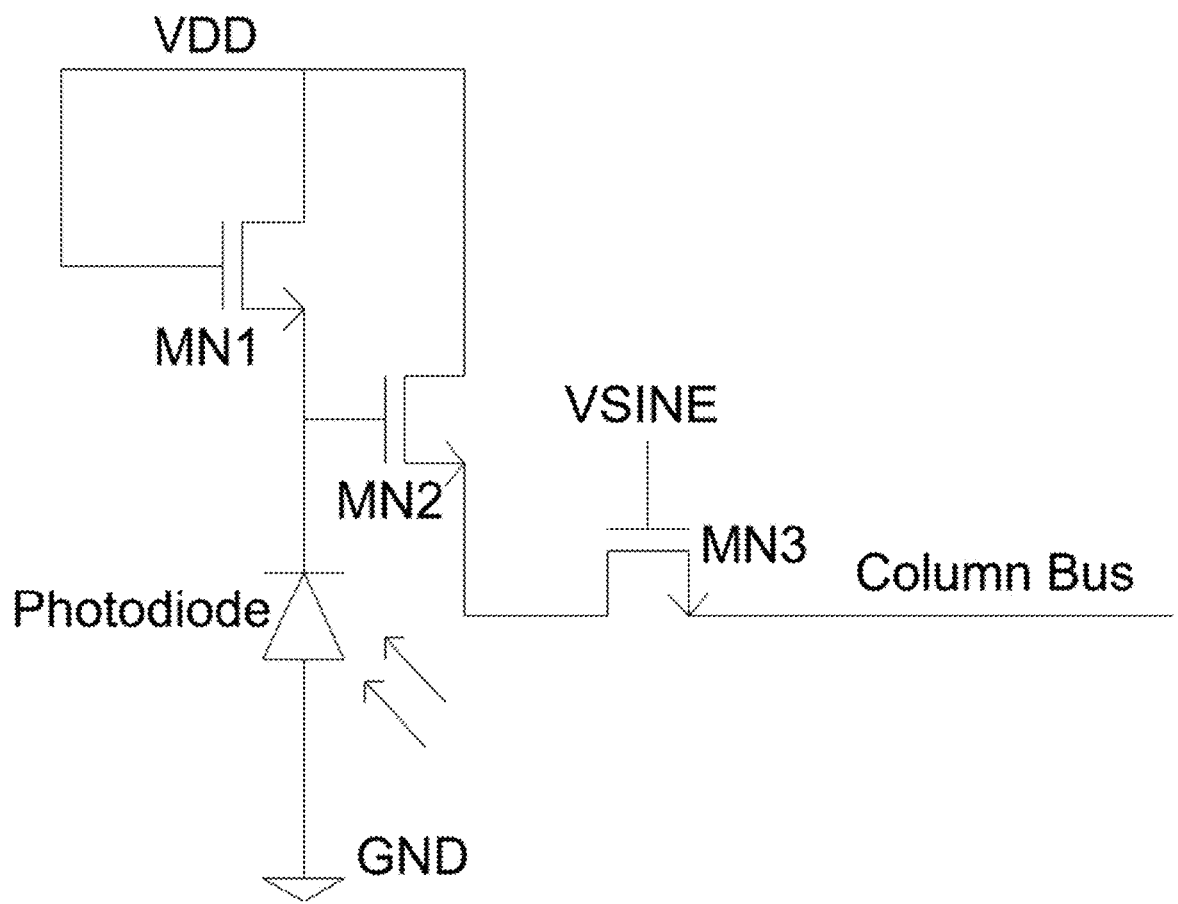
FIG. 3 shows an Amplitude Modulated (AM) pixel setup as a logarithmic pixel with continuous output to the column bus in accordance with the present invention.

FIG. 3 shows an Amplitude Modulated (AM) pixel setup as a logarithmic pixel with continuous output to the column bus in accordance with the present invention.

In operation and with regard to FIG. 3, the voltage across the given photodiode in the pixel array is amplified through a conventional drain amplifier of gain close to 1. The buffered voltage VDD is on the source of a second transistor. The base of the transistor is fed the carrier signal VSINE and which signal is established such that the transistor remains exclusively in the linear region. The drain of the second transistor is held to a virtual source such that current flowing through the transistor takes an approximate form of:

$$I_{Pixel} = A_{Photodiode} * \sin_{Carrier}(2\pi ft + \tau) + I_{Offset},$$

where f is the frequency of the carrier,

τ is the phase of the carrier, $I_{Offset}$ is a DC offset current, and t is time.

This way, multiple arrayed pixels may output the current, $I_{Pixel}$, onto the column bus without interfering with each other and the total current on the line becomes a superposition of all pixels. Alternate implementations are of course within the scope of the intended invention which may replace this modulation scheme with a Gilbert cell or other multiplication circuit to create a signal on the column bus that represents a superposition of all pixels and their carrier signals.

The output current from the combination of pixels is then converted into a voltage using an operational amplifier configured as a transimpedance amplifier. The offset currents are removed to maximize output swing. The final voltage is then passed through a low pass filter and sampled using an analog to digital converter. This analog to digital converter should have a sampling frequency that fulfills the Nyquist requirement. In the digital domain, the individual pixels may be recovered using standard demodulation techniques.

For the preferred implementation of the present invention, demodulation should include passing the signal through a bandpass filter to remove other pixels, removing the negative values, and passing the signal through a low pass filter to recover the pixel exposure value. This is a standard method of demodulating AM signals. Alternate implementations may be provided with the following variations: filtering the signal before converting the signal from current to voltage; performing the bandpass filtering before sampling the signal; performing the low pass filtering before sampling; or using an intermediate frequency conversion to lower the Nyquist frequency.

After the signal has been sampled and demodulated, all the pixel values may therefore be obtained. In this manner, the maximum recoverable framerate would be half of the separation of the carriers in the frequency domain.

It should be clear that, for an array of pixels, the pixel outputs for a single column can be read/retrieved simultaneously by simply reading and demodulating the bus signal for the bus line serving that single column. Similarly, the pixel outputs for other columns can be read/retrieved by reading and demodulating the bus signal for the bus line serving those other columns. If desired, this concept can be applied to pixels being read in a row-wise manner. The output of pixels in a specific row can be read/retrieved by reading the bus signal for the row bus line serving that specific row.

From the above, it should be clear that, for an array of pixels, the output of all the pixels can be read by serially reading the bus signal on each bus line serving each column. Or, of course, alternatively, the output of all the pixels can be read serially by reading the bus signal on each bus line serving each row.

The above concept can be expanded by having an array of pixels such that each column output and each row is modulated separately from the other rows and columns. This arrangement would allow for simultaneously reading/retrieving the output of all the pixels. The output of all the pixels can then be amplified by, preferably, a single amplifier.

It should also be clear that the system may be configured such that the modulating carrier signal for columns is different from the modulating carrier signal for rows. The column modulating carrier signal may be completely different from the row modulating carrier signal. These modulating carrier signals may be generated by different carrier generators. Or, alternatively, a single carrier signal generator may be used to generate the modulating carrier signals. In the variant with a single carrier signal generator, the column modulating carrier signals would have different phases and/or frequencies from the row modulating carrier signals.

The above allows for simultaneous output of all the pixels. With each row being modulated differently from other rows and with each column output being modulated differently from other column outputs, all outputs can thus be read simultaneously. All row outputs can be placed on their respective column buses and are superimposed over one another. All column outputs, since they are all differently modulated as well, can thus be read/retrieved simultaneously as well. This allows for simultaneous or near-simultaneous retrieval of all pixel outputs for the array. The modulated column outputs can then be demodulated to retrieve each separate column output. Each demodulated column output can then be, in turn, demodulated to retrieve the various pixel outputs.

A person understanding this invention may now conceive of alternative structures and embodiments or variations of the above all of which are intended to fall within the scope of the invention as defined in the claims that follow.

We claim:

1. An apparatus for sensing an image, said apparatus comprising:
   a complementary metal oxide semiconductor (CMOS) sensor comprising an array of pixels with an intensity-based readout; and
   an analog network including at least one carrier generator operably coupled to said array of pixels,
   wherein each pixel in said array of pixels is fed with a carrier signal and wherein, for said each pixel, said carrier signal is modulated with a value representing an exposure of said each pixel,
   and wherein said pixels output a current, IPixel, in the form of $$IPixel = APhotodiode * sinCarrier(2\pi ft + \tau) + IOffset,$$

where f is the frequency of the carrier, $\tau$ is the phase of the carrier, IOffset is a DC offset current, and t is time.

2. The apparatus as claimed in claim 1, wherein said array of pixels and said analog network are configured on an integrated circuit chip.

3. The apparatus as claimed in claim 1, wherein, for a specific row of said array, all pixel outputs are output onto a row bus simultaneously.

4. The apparatus as claimed in claim 1, wherein each said carrier signal is unique.

5. The apparatus as claimed in claim 1, wherein, for a specific column of said array, all pixel outputs are output onto a common bus simultaneously.

6. The apparatus as claimed in claim 1, wherein said carrier signal and said intensity-based readout are combined such that pixel signals are superimposed on a bus and recoverable.

7. The apparatus according to claim 1, wherein said at least one carrier generator generates at least two different carrier signals such that outputs of pixels in different rows of pixels in said array of pixels are modulated by different carrier signals.

8. The apparatus according to claim 1, wherein said at least one carrier generator generates at least two carrier signals such that outputs of pixels in different rows of pixels in said array of pixels are modulated by carrier signals that do not interfere with one another.

9. The apparatus according to claim 8, wherein said at least one carrier generator generates at least two carrier signals such that outputs of pixels in different rows of pixels in said array of pixels are modulated by carrier signals with different frequencies.

10. The apparatus according to claim 8, wherein said at least one carrier generator generates at least two carrier signals such that outputs of pixels in different rows of pixels in said array of pixels are modulated by carrier signals with different phases.

11. A method for sensing an image, said method comprising:
    providing a complementary metal oxide semiconductor (CMOS) sensor comprising an array of pixels having an intensity-based readout; and
    coupling said array with an analog network comprising at least one carrier generator,
    wherein each pixel in said array of pixels is fed with a carrier signal and wherein for said each pixel, said carrier signal is modulated with a value representing an exposure of said each pixel,
    and wherein said pixels output a current, IPixel, in the form of $$IPixel = APhotodiode * sinCarrier(2\pi ft + \tau) + IOffset$$

where f is the frequency of the carrier, $\tau$ is the phase of the carrier, IOffset is a DC offset current, and t is time.

12. The method as claimed in claim 11, wherein said pixels output said current, IPixel, onto a column bus without interfering with one another and total current output from said array forms a superposition of all pixels.

13. The method of claim 11, wherein said at least one carrier generator generates at least two different carrier signals such that outputs of pixels in different rows of pixels in said array of pixels are modulated by different carrier signals.

14. The method of claim 11, wherein said at least one carrier generator generates at least two carrier signals such that outputs of pixels in different rows of pixels in said array of pixels are modulated by carrier signals that do not interfere with one another.

15. The method of claim 14, wherein said at least one carrier generator generates at least two carrier signals such that outputs of pixels in different rows of pixels in said array of pixels are modulated by carrier signals with different frequencies.

16. The method of claim 14, wherein said at least one carrier generator generates at least two carrier signals such that outputs of pixels in different rows of pixels in said array of pixels are modulated by carrier signals with different phases.

17. A system for sensing an image, the system comprising:
    a complementary metal oxide semiconductor (CMOS) sensor comprising an array of pixels, each pixel having an intensity-based output;
    a plurality of mixer circuit elements; and
    at least one bus line to which mixer circuit elements are coupled, each of said at least one bus line carrying a bus signal;
    wherein, for a plurality of said pixels, each pixel's output is mixed by one of said mixer circuit elements with a carrier signal such that said bus signal on said at least one bus line is a superposition of multiple pixel outputs modulated by said carrier signal, and wherein, for each pixel in said plurality of said pixels, said carrier signal is modulated with a value representing an exposure of said each pixel,
    and wherein said pixels output a current, IPixel, in the form of $$IPixel = APhotodiode * sinCarrier(2\pi ft + \tau) + IOffset,$$

where f is the frequency of the carrier, $\tau$ is the phase of the carrier, IOffset is a DC offset current, and t is time.

18. The system according to claim 17, wherein each pixel has a corresponding mixer circuit element.

19. The system according to claim 17, wherein said array of pixels comprises at least two rows of pixels.

20. The system according to claim 19, wherein, for each row of pixels, pixel outputs are modulated by a different carrier signal such that outputs of pixels in different rows of pixels are modulated by different carrier signals.

21. The system according to claim 17, wherein said multiple pixel outputs are demodulated to recover pixel exposure values for said multiple pixels.

22. The system according to claim 20, wherein said different carrier signals are non-overlapping in a frequency domain.

23. The system according to claim 17, wherein pixel outputs of pixels in a specific column in said array are simultaneously retrieved by retrieving said bus signal from a bus line coupled to said specific column.

24. The system according to claim 23, wherein, for said system, each column output is differently modulated from other column outputs.

25. The system according to claim 24, wherein all pixel outputs are simultaneously retrieved by simultaneously reading all column outputs.

* * * * *